United States Patent [19]

Abe

[11] Patent Number: 5,023,753
[45] Date of Patent: Jun. 11, 1991

[54] PRINTED CIRCUIT

[75] Inventor: Hirotoshi Abe, Saitama, Japan

[73] Assignee: Kabushiki Kaisha Toshiba, Kawashi, Japan

[21] Appl. No.: 461,422

[22] Filed: Jan. 5, 1990

[30] Foreign Application Priority Data

Jan. 13, 1989 [JP] Japan .................................. 1-6644

[51] Int. Cl.⁵ ............................................. H05K 7/02
[52] U.S. Cl. ................................................ 361/400
[58] Field of Search ............... 361/393, 397, 400, 414; 174/51, 250, 261; 333/12, 204

[56] References Cited

U.S. PATENT DOCUMENTS

| 4,725,920 | 2/1988 | Ijichi et al. | 361/414 |
| 4,739,448 | 4/1988 | Rowe et al. | 361/414 |
| 4,739,453 | 4/1988 | Kurokawa | 174/250 |

OTHER PUBLICATIONS

"Multiple LSI Silicon Chip Modules . . . ", IBM Technical Disclosure Bulletin, vol. 22, No. 8A, C. W. Ho et al., Jan. 1980.
Japanese Publication, "Knowhow of High Frequency Circuit Design", pp. 52-57, Jul. 20, 1985 (First Edition), Feb. 1, 1987 (4th Edition).

Primary Examiner—Leo P. Picard
Assistant Examiner—Paramita Ghosh
Attorney, Agent, or Firm—Cushman, Darby & Cushman

[57] ABSTRACT

According to such formation, a common mode noise source will be produced between a ground pattern and signal pattern parallelly formed adjacently to the signal pattern and normal mode noise sources will be produced respectively between the signal pattern and a ground plane and between ground pattern and ground plane. However, the noise from the common mode noise source will be canceled by a capacitor between the signal pattern and ground pattern and the normal mode noises produced respectively between the signal pattern and ground plane and between the ground pattern and ground plane can be absorbed into the ground plane by the capacitor between the signal pattern and ground plane and the capacitor between the signal pattern and ground plane. Also, the common mode noise flowing into the ground pattern can be more positively removed by using a line filter.

2 Claims, 3 Drawing Sheets

PRINTED CIRCUIT

BACKGROUND OF THE INVENTION

1. Field of the Invention

This invention relates to printed circuit which is made by electronic circuits such as digital circuits on printed circuit board and more particularly to a both surface printed circuit provided with a ground plane so as to inhibit a noise generating phenomenon on the ground plane by a radiation from a signal pattern and to make it possible to package a circuit with little noise.

2. Description of the Related Art

The high speed circuit processing has recently advanced in digital circuits used in electronic devices. When the circuit is processed at a higher speed, clock signals and other signals will be made higher in the frequency and an unnecessary radiation will be generated by the influence of their harmonic waves.

As a countermeasure against it, there is a method of inhibiting the unnecessary radiation by adopting a so-called ground plane forming a ground pattern as a surface by using a both surface or multilayer printed circuit for a printed circuit forming a digital circuit.

That is to say, as shown in FIG. 6, circuit devices 2 and 3 each having a plurality of terminals are fitted to one surface (which shall be called a part surface hereinafter) of an insulating board 1, an output terminal 2b of the circuit device 2 and an input terminal 3b of the circuit device 3 are connected with each other through a signal pattern 4 so that an unnecessary radiation generated from this signal pattern 4 may be inhibited by a ground plane 5. This drawing is of an example of a both surface printed circuit board in which the ground plane 5 is formed on the other surface of the insulating board 1 and such terminals which must not be grounded as the signal output terminal 2b and input terminal 3b are prevented from being connected with the ground plane 5 by holes (cutout holes) 7 made by cutting out parts of the ground plane 5. Also, on the part surface, a ground pattern 6 made to be of the same potential as of a ground plane 5 is formed of jumper wires or through holes. The ground terminals 2a and 3a of the circuit devices 2 and 3 are passed through the cutout holes 7 formed in the ground plane 5 so as not to be connected directly with the ground plane 5.

However, in case the ground plane 5 is provided as mentioned above, a high frequency current flowing through the signal pattern 4 will flow as a normal mode noise through the ground plane 5 through a stray capacitor $C_1$ produced between the signal pattern 4 and ground plane 5 shown in FIG. 7 or will flow as a common mode noise through the ground pattern 6. In such case, as other circuit devices are also fitted to the printed circuit board a high frequency current from these devices will be added and thus, if a great high frequency current flows, the potentials of the ground pattern 6 and ground plane 5 will produce a high frequency potential difference, thereby the potential of the ground plane 5 will become unstable and, depending on the high frequency current, an unnecessary radiation will be thought to be caused from the ground part.

As explained above, in the conventional printed circuit in which the ground plane 5 is formed to inhibit the unnecessary radiation, there has been a problem that the high frequency current flowing through the signal pattern 4 will flow through the ground plane 5 and the ground pattern 6 on the same plane and the potential difference between both grounds will become unstable to cause an unnecessary radiation.

SUMMARY OF THE INVENTION

This invention has it as an object to provide a printed circuit in which a high frequency fluctuation of a ground potential by a radiation of a high frequency signal from a signal pattern is inhibited to reduce an unnecessary radiation from a ground part.

That is to say, an embodiment of this invention is a printed circuit having first and second conductor layers formed respectively on the side of one surface and on the side of the other surface of an insulating substrate to hold the substrate, comprising:

a ground plane forming said first conductor layer and formed on the side of the first surface of the insulating substrate;

first and second circuit devices each having at least a signal input and output terminal and ground terminal and fitted to said insulating substrate;

a signal pattern forming said second conductor layer, formed on the side of the second surface of said insulating substrate and connecting the signal input and output terminals of said first and second circuit devices with each other;

a ground pattern forming said second conductor layer, formed on the side of the second surface of said insulating substrate, connecting the ground terminals of said first and second circuit devices with each other and formed to be parallelly adjacent to said signal pattern; and an inductance device electrically connecting said ground pattern and ground plane with each other, stray capacitances being formed respectively between said signal pattern and ground pattern, between the signal pattern and ground plane and between the ground pattern and ground plane.

Another embodiment of this invention is a printed circuit according to said embodiment characterized in that line filters are arranged to connect respectively the signal input and output terminals of said first and second circuit devices with each other and the ground terminals of said first and second circuits with each other.

DETAILED DESCRIPTION OF THE PREFERRED EMBODIMENTS

Figure 1:
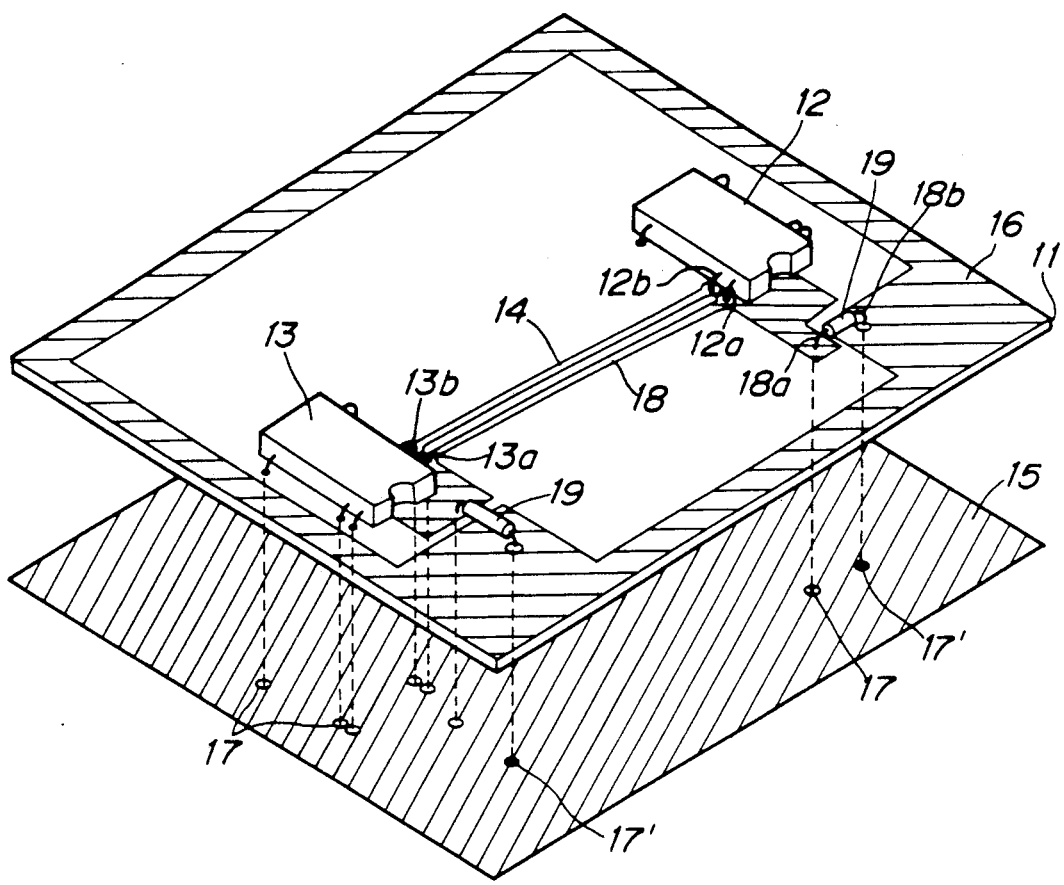
FIG. 1 is a schematic perspective view showing an embodiment of the printed circuit according to the present invention.

FIG. 1 is a perspective view showing an embodiment of the printed circuit according to the present invention.

In FIG. 1, the reference numeral 11 represents an insulating board forming a ground plane 15 on one surface and a signal pattern 14 and ground patterns 16 and 18 which are mother bodies of a mounted circuit on the other surface.

The reference numerals 12 and 13 represent circuit devices provided with such signal input and output functions as of digital integrated circuits and formed respectively, for example, of a circuit device 12 as a signal source circuit and a circuit device 13 as a load side circuit.

The above mentioned ground patterns 16 and 18 are separated from each other and the ground pattern 18 connects the respective ground terminals 12a and 13a of the circuit devices 12 and 13 with each other to give a common ground potential to both circuit devices 12 and 13. The ground pattern 16 gives a ground potential even to the other integrated circuits than the circuit devices 12 and 13. The ground pattern 18 is connected to the ground pattern 16 through such high frequency coils 19 as bead cores and the ground patterns 16 and 18 are separated from each other in respect of the high frequency. By the way, said high frequency coils 19 are provided near the respective ground terminals 12a and 13a.

On the other hand, the signal output terminal 12b and input terminal 13b are connected with each other through a signal pattern 14. In this case, said ground pattern 18 is parallelly formed adjacently to this signal pattern 14. By the way, cutout holes 17 are provided to prevent the respective terminals 12a, 13a, 12b, 13b, ... of the circuit devices 12 and 13 from contacting with the ground plane 15. However, said high frequency coil 19 is connecated at one end to the terminal 18a (soldered land) of the ground pattern 18 and at the other end to the terminal 18b of the ground pattern 16 through a connecting point 17' shown by a black circle. In this case, the terminal 18a of the ground pattern 18 will not be connected with the ground plane 15.

Figure 2:
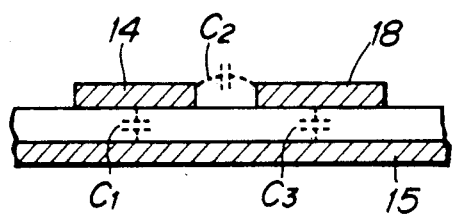
FIG. 2 is a sectioned view of the embodiment in FIG. 1.

In the printed circuit of the above mentioned formation, such stray capacitors $C_1$, $C_2$ and $C_3$ as are shown in FIG. 2 will be formed respectively among the ground plane 15, signal pattern 14 and ground pattern 18. $C_1$ represents the capacitor between the signal pattern 14 and ground plane 15, $C_2$ represents the capacitor between the signal pattern 14 and ground pattern 18 and $C_3$ represents the capacitor between the ground pattern 18 and ground plane 15.

Figure 3:
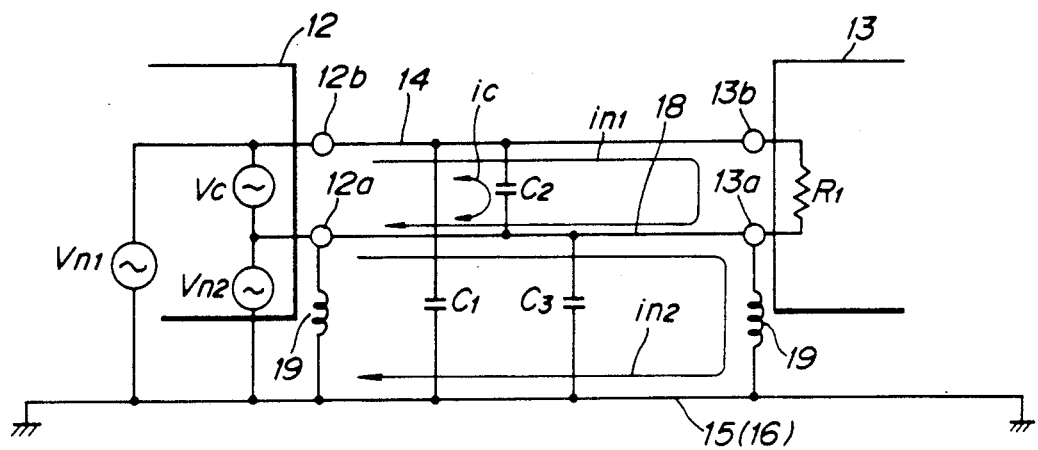
FIG. 3 is an equivalent circuit diagram of the embodiment shown in FIG. 1.

When such stray capacitors are formed, the printed circuit in FIG. 1 will be represented by such equivalent circuit as in FIG. 3. In FIG. 3, the circuit device 12 side is assumed to be a signal source circuit and the circuit device 13 is assumed to be a load circuit. The elements equivalent to those in FIG. 1 shall bear the same reference numerals.

In the circuit device 12 to be a signal source circuit, a common mode noise source Vc is present between the signal output terminal 12b and ground terminal 12a and normal mode noise sources Vn1 and Vn2 are present respectively between the signal output terminal 12b and ground plane 15 and between the ground terminal 12a and ground plane 15.

If the ground plane 15 is absent, the stray capacitor $C_2$ will be present only between the signal pattern 14 and ground pattern 18. In such case, a high frequency current Ic by Vc as a normal mode noise source will be radiated from the signal pattern 14 and will flow as a differential component to the ground pattern 18, a high frequency current in1 will flow in the form of a loop to the ground pattern 16 through a load resistance R1 and high frequency coil 19 within the circuit device 13 from the signal pattern 14 and a high frequency current in2 by the normal mode noise source Vn2 will flow through a loop cource by the ground pattern 18, high frequency coil 19 and ground pattern 16.

However, in case the ground plane 15 is present, as the stray capacitors $C_1$ and $C_3$ by the ground plane 15 are present, the current ic based on the common mode noise source Vc will be canceled by the capacitor $C_2$ and the currents in1 and in2 will flow respectively through the capacitors $C_1$ and $C_3$ and will be absorbed by the ground plane 15. In such case, as $C_1 = C_3$, there will be no bad influence by $C_1$ and $C_3$.

Also, in this embodiment, as the ground pattern 18 is separated in respect of the high frequency from the ground pattern 15 (16) by the high frequency coils 19, no great high frequency current will flow through the ground plane 15, thereby the potential of the ground plane 15 will be stabilized and an unnecessary radiation will be prevented.

Thus, in the printed circuit by said embodiment, stray capacitors can be positively utilized to reduce noises in the respective modes and prevent an unnecessary radiation.

Another embodiment shall be explained in the following.

Figure 4:
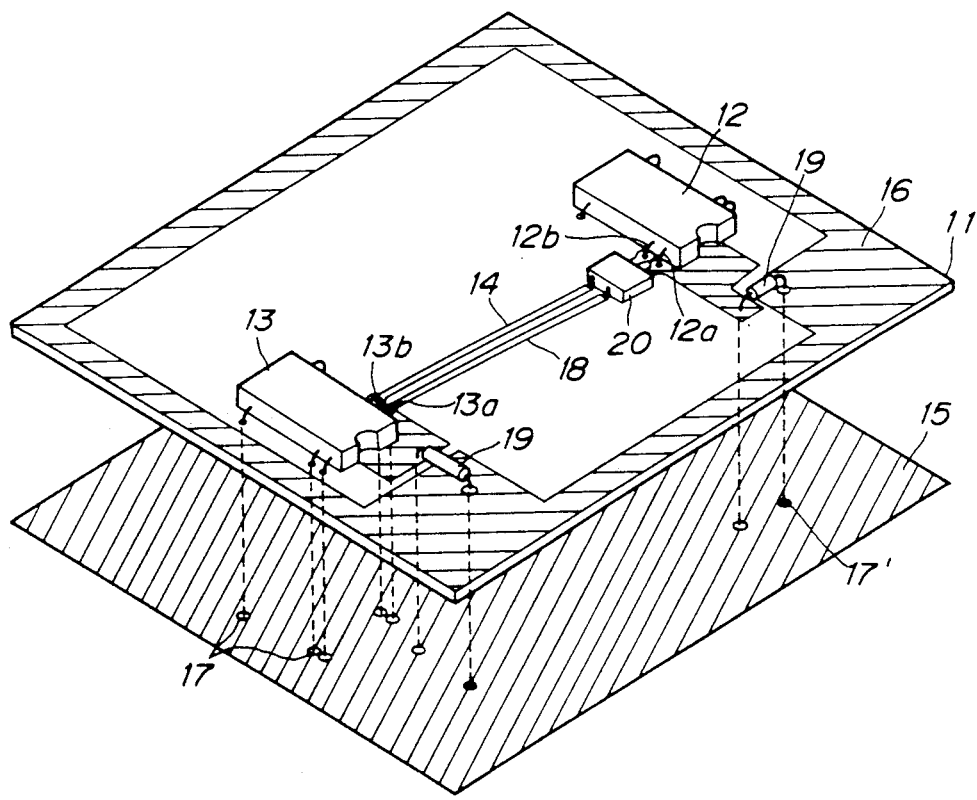
FIG. 4 is a schematic perspective view showing another embodiment of the present invention.

In said first embodiment, the inhibition of the common mode noise is not perfect. Therefore, as shown in FIG. 4, a choke 20 as a line filter is connected between the signal pattern 14 and ground pattern 18.

Figure 5:
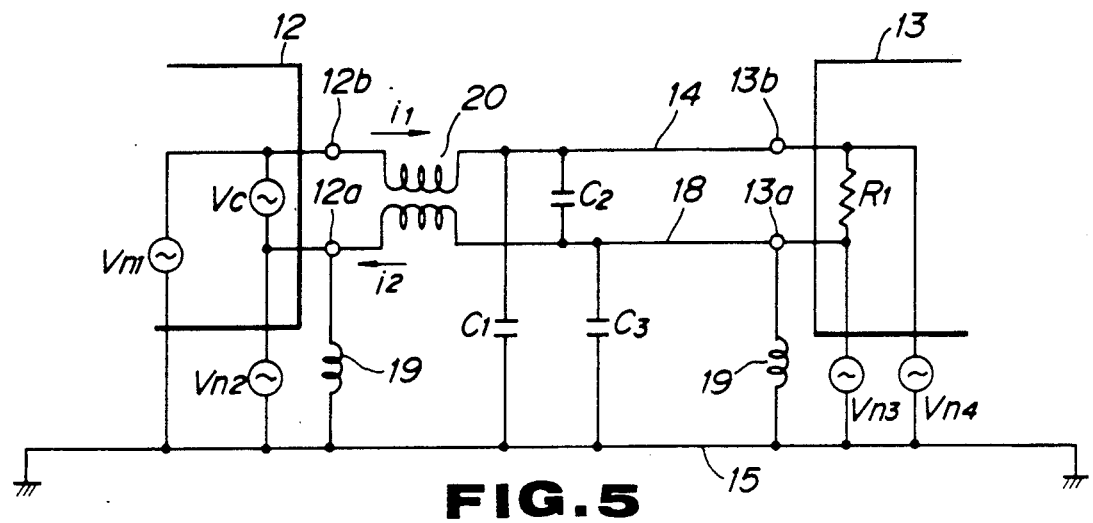
FIG. 5 is an equivalent circuit diagram of the embodiment in FIG. 4.
Figure 6:
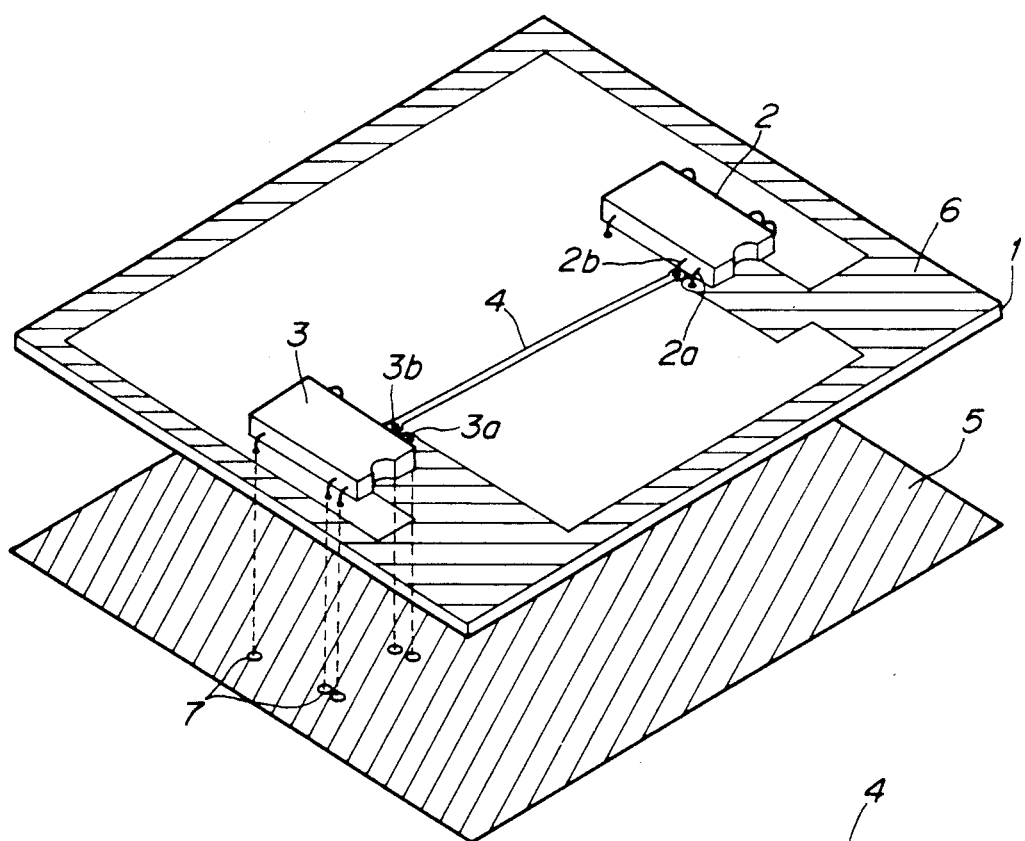
FIG. 6 is a schematic perspective view showing a conventional printed circuit
Figure 7:
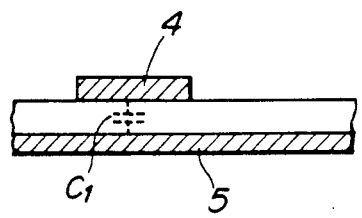
FIG. 7 is a sectioned view of the printed circuit shown in FIG. 6.

FIG. 5 shows an equivalent circuit in which the choke 20 is connected. The currents forming a common mode noise are a signal current i1 flowing to the load circuit device 13 through the signal pattern 14 from the signal source circuit device 12 and a current i2 flowing to the signal source circuit device 12 through the ground pattern 18 from the load circuit device 13. These currents i1 and i2 are of alternating current components of phases reverse to each other and are canceled with each other by flowing through the choke 20. Thus, the signal waveform in the circuit device 12 and the signal waveform in the circuit device 13 will coincide with each other to prevent an unnecessary radiation.

Also, the normal mode noise source will relate to the noise sources Vn3 and Vn4 and will become Vn1, Vn2, Vn3 and Vn4 which will appear respectively between the signal input terminal 13b and ground plane 15 of the circuit device 13 and between the ground terminal 13a and ground plane 15. Said choke 20 will inhibit also the noises from such normal mode noise sources Vn1, Vn2, Vn3 and Vn4.

As explained above, according to this invention, there is an effect of preventing an unnecessary radiation from a ground plate by inhibiting the generation of a common mode noise and normal mode noise.

What is claimed is:
1. A printed circuit board, comprising:
   an insulating board;
   a first conductor layer formed on a first surface side of said insulating board,
   said first conductor layer being a ground plane located on the side of the first surface of said insulating board;
   first and second circuit devices each having at least a signal input and output terminal and ground terminal and located on said insulating board;

a second conductor layer, formed on a second surface side of said insulating board, having a signal pattern on the side of the second surface of said insulating board, and said signal pattern connecting said signal input and output terminals of said first and second circuit devices with each other;

said second conductor layer also having a ground pattern located on the side of said second surface of said insulating board, which connects said ground terminals of said first and second circuit devices with each other and said ground pattern being adjacent and parallel to said signal pattern; and an inductance device electrically connecting said ground pattern and ground plane with each other, stray capacitances existing respectively between said signal pattern and ground pattern, between said signal pattern and ground plane and between said ground pattern and ground plane.

2. A printed circuit according to claim 1 further comprising at least one line filter connected between said signal input and output terminals of said first and second circuit devices and between said ground terminals of said first and second circuit devices.

* * * * *